United States Patent
Lee

(10) Patent No.: US 12,179,776 B2
(45) Date of Patent: Dec. 31, 2024

(54) APPARATUS AND METHOD FOR DETERMINING OPTIMAL VELOCITY OF VEHICLE

(71) Applicants: Hyundai Motor Company, Seoul (KR); Kia Corporation, Seoul (KR)

(72) Inventor: Hee Yun Lee, Whasung-Si (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 625 days.

(21) Appl. No.: 17/405,867

(22) Filed: Aug. 18, 2021

(65) Prior Publication Data
US 2022/0203997 A1 Jun. 30, 2022

(30) Foreign Application Priority Data
Dec. 29, 2020 (KR) .................. 10-2020-0185586

(51) Int. Cl.
*B60W 40/10* (2012.01)
*B60W 40/04* (2006.01)
(Continued)

(52) U.S. Cl.
CPC ............ *B60W 40/10* (2013.01); *B60W 40/04* (2013.01); *G01R 31/382* (2019.01); *G01S 19/01* (2013.01);
(Continued)

(58) Field of Classification Search
CPC .. B60W 20/00; B60W 20/12; B60W 30/0956; B60W 30/143; B60W 30/146; B60W 30/16; B60W 30/162; B60W 30/18163; B60W 40/04; B60W 40/10; B60W 50/0097; B60W 60/0023;
(Continued)

(56) References Cited

U.S. PATENT DOCUMENTS

| 2014/0277835 A1* | 9/2014 | Filev ................... G01C 21/3469 701/2 |
| 2020/0133226 A1* | 4/2020 | Tsuneki ................ G06N 20/00 |

(Continued)

FOREIGN PATENT DOCUMENTS

| KR | 10-2009-0061696 A | 6/2009 |
| KR | 10-2012-0109097 A | 10/2012 |

(Continued)

*Primary Examiner* — Peter D Nolan
*Assistant Examiner* — Ce Li Li
(74) *Attorney, Agent, or Firm* — Morgan, Lewis & Bockius LLP

(57) ABSTRACT

An apparatus of determining an optimal velocity of a vehicle, may include an information receiving unit configured to receive and provide vehicle traveling information and traveling environment information which are state variables representing vehicle states required to determine a target velocity for optimizing vehicle fuel economy; and an optimal velocity determination unit configured to determine the target velocity in accordance with a vehicle traveling environment by use of a state variable and reward estimation model and a Q table having values according to the state variables and a control input, from the vehicle traveling information and the traveling environment information provided by the information receiving unit, and a method of determining an optimal velocity of a vehicle.

18 Claims, 2 Drawing Sheets

(51) Int. Cl.
*G01R 31/382* (2019.01)
*G01S 19/01* (2010.01)

(52) U.S. Cl.
CPC ... *B60W 2510/244* (2013.01); *B60W 2520/00* (2013.01); *B60W 2552/00* (2020.02); *B60W 2554/80* (2020.02)

(58) Field of Classification Search
CPC . B60W 2050/0025; B60W 2050/0031; B60W 2510/244; B60W 2520/00; B60W 2520/10; B60W 2552/00; B60W 2552/05; B60W 2552/15; B60W 2552/20; B60W 2552/30; B60W 2554/4041; B60W 2554/406; B60W 2554/80; B60W 2554/801; B60W 2554/802; B60W 2554/804; B60W 2555/60; B60W 2556/50; B60W 2720/10; B60W 2720/103; B60W 2720/106; B60W 2754/30; G01C 21/3446; G01C 21/3453; G01C 21/3469; G01R 31/382; G01S 19/01

See application file for complete search history.

(56) References Cited

U.S. PATENT DOCUMENTS

| | | | | |
|---|---|---|---|---|
| 2020/0257252 | A1* | 8/2020 | Tsuneki | G05B 13/042 |
| 2020/0279158 | A1* | 9/2020 | Tsunoda | G06N 20/00 |
| 2020/0398859 | A1* | 12/2020 | Borhan | F01N 3/2066 |
| 2021/0009128 | A1* | 1/2021 | Jokela | B60W 30/18163 |
| 2021/0072710 | A1* | 3/2021 | Liang | G05B 19/414 |
| 2021/0114580 | A1* | 4/2021 | Hashimoto | B60W 10/06 |
| 2021/0341895 | A1* | 11/2021 | Havlena | G05B 19/0425 |
| 2022/0242390 | A1* | 8/2022 | Li | B60W 10/06 |
| 2023/0104214 | A1* | 4/2023 | Pareek | G06Q 10/04 700/28 |

FOREIGN PATENT DOCUMENTS

| | | |
|---|---|---|
| KR | 10-2014-0078281 A | 6/2014 |
| KR | 10-2014-0094288 A | 7/2014 |
| KR | 10-2015-0003007 A | 1/2015 |
| KR | 10-2015-0132874 A | 11/2015 |
| KR | 10-2017-0016706 A | 2/2017 |
| KR | 10-2018-0055053 A | 5/2018 |
| KR | 10-2018-0065502 A | 6/2018 |

* cited by examiner

APPARATUS AND METHOD FOR DETERMINING OPTIMAL VELOCITY OF VEHICLE

CROSS-REFERENCE TO RELATED APPLICATION

The present application claims priority to Korean Patent Application No. 10-2020-0185586 filed on Dec. 29, 2020, the entire contents of which is incorporated herein for all purposes by this reference.

BACKGROUND OF THE INVENTION

Field of the Invention

The present invention relates to an apparatus and a method for determining an optimal velocity of a vehicle, and more particularly, to an apparatus and a method for determining a velocity, which are capable of optimizing fuel economy of an autonomous vehicle.

Description of Related Art

Recently, a route guide service is widely used. When a driver inputs a destination, the route guide service searches for an optimal route from a current position to the destination and provides and guides the searched route in a form of voice and images to the driver.

In a vehicle, the route guide service may be provided by a vehicle navigation device, that is, a navigation device, provided with various sensors such as a global positioning system (GPS) sensor, a vehicle speed sensor, and a gyro sensor.

When a vehicle driver transmits information related to the current position and the destination to a road information provider by use of the navigation device, the road information provider refers to geographic information and real-time traffic information to determine optimal or shortest route guidance data from the current position to the destination and transmits the determined route guidance data back to the navigation device.

The route guide service advantageously provides the driver with the shortest or optimal route from the current position to the destination, safely guiding the driver, who drives to a location new to him/her, to the destination and allowing the driver to prepare for unpredictable traffic situations.

In the future, a vehicle provided with an autonomous driving function, that is, an autonomous vehicle configured for fully automatically traveling from a current position to a predetermined destination while recognizing vehicle states and surrounding environments without the driver's intervention is expected to be released.

A current level of an autonomous vehicle has reached a level of a semi-autonomous driving applied with an advanced driver assistance system (ADAS) such as cruise control for controlling the vehicle so that the vehicle travels at a predetermined velocity set by the driver or a velocity having a predetermined pattern, advanced smart cruise control (ASCC) for controlling the vehicle so that the vehicle travels at a predetermined velocity while automatically adjusting an interval from the preceding vehicle, and a lane departure warning system (LDWS) and a lane keeping assist system (LKAS) for maintaining a traveling lane and preventing a departure from the lane.

Regarding autonomous vehicles to be released in the future, research and development are being actively conducted on a technology for generating a stable traveling route in consideration of traffic environments, which change in real time, and avoidance of collision with peripheral dynamic obstacles, or a technology for allowing the vehicle to travel based on a velocity profile for optimizing vehicle fuel economy when the vehicle travels along the generated traveling route.

As known, a current cruise control technology of a vehicle is at a level of controlling the vehicle so that the vehicle travels at a predetermined velocity (e.g., 100 km/h) set by the driver or in a predetermined pattern (e.g., Pulse & Glide).

However, there is a demand for a velocity control technology configured for maximizing fuel economy of the vehicle to commercialize the autonomous vehicle. Therefore, various types of research and development are being conducted to determine a velocity profile for maximizing fuel economy of the vehicle while the vehicle travels.

However, there is difficulty in technology development because of uncertainty in modeling vehicle traveling environments, difficulty in ensuring real-time controllability of control algorithm, and difficulty in predicting future traveling information.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing an apparatus and a method for determining an optimal velocity of a vehicle, which are configured for optimizing fuel economy. An object of the present invention is directed to providing an apparatus and a method for determining an optimal velocity of a vehicle, which are configured for optimizing fuel economy in accordance with various vehicle traveling environments and various vehicle states.

The object of the present invention is not limited to the above-mentioned object, and other objects, which are not mentioned above, may be clearly understood from the following descriptions by those with ordinary skill in the art (hereinafter, referred to as 'those skilled in the art') to which various exemplary embodiments of the present invention pertains.

Various aspects of the present invention provide an apparatus of determining an optimal velocity of a vehicle, the apparatus including: an information receiving unit configured to receive and provide vehicle traveling information and traveling environment information which are state variables representing vehicle states required to determine a target velocity for optimizing vehicle fuel economy; and an optimal velocity determination unit configured to determine the target velocity in accordance with a vehicle traveling environment by use of a state variable and reward estimation model and a Q table having values according to the state variables and a control input, from the vehicle traveling information and the traveling environment information provided by the information receiving unit.

In another aspect, various aspects of the present invention provide a method of determining an optimal velocity of a vehicle, the method including: receiving, by an information receiving unit, vehicle traveling information and traveling environment information which are state variables representing vehicle states required to determine a target velocity for optimizing vehicle fuel economy; and determining, by an optimal velocity determination unit, the target velocity in accordance with a vehicle traveling environment by use of a state variable and reward estimation model and a Q table having values according to the state variables and a control input, from the vehicle traveling information and the traveling environment information provided by the information receiving unit.

In various exemplary embodiments of the present invention, the vehicle traveling information and the traveling environment information, which are state variables, may include one or more of vehicle position information, information related to a current velocity of the vehicle, information related to a gradient of a traveling road, a distance from a preceding vehicle, information related to real-time traffic on a road on a vehicle traveling route, and information related to an amount of remaining energy of the vehicle.

In another exemplary embodiment of the present invention, the optimal velocity determination unit may include: a calculation unit configured to estimate energy consumption according to a current velocity of the vehicle and a control input, determined and provided by a control unit, and a velocity of a next step by use of the state variable and reward estimation model, from the vehicle traveling information and the traveling environment information, and to determine and update a Q table value by use of the estimated information; and the control unit configured to determine a target velocity and a control input having the smallest Q function value, the Q function value being a value of a Q table, by use of Q table information provided by the calculation unit or previously stored Q table information.

In yet another exemplary embodiment of the present invention, the calculation unit may include: a state variable and reward estimation model unit configured to estimate the energy consumption according to the current velocity of the vehicle and the control input for following the target velocity, and the velocity ($v_{k+1}$) of the next step by use of the state variable and reward estimation model, from the vehicle traveling information and the traveling environment information; and a Q table optimization calculation unit configured to determine and update the Q table value by use of the information estimated by the state variable and reward estimation model unit and provide the updated Q table value to the control unit.

In yet another exemplary embodiment of the present invention, the Q table optimization calculation unit may update the Q value representing a control policy according to the vehicle traveling information and the traveling environment information by use of a model-based reinforcement learning algorithm.

According to the apparatus and the method for determining an optimal velocity according to various exemplary embodiments of the present invention, it is possible to provide the target velocity by which the fuel economy may be optimized through learning in accordance with various vehicle traveling environments and various vehicle states based on the reinforcement learning algorithm which is a field of machine learning.

As a result, the vehicle velocity control may be performed in accordance with the vehicle traveling environment, further improving the vehicle fuel economy in comparison with a general cruise control technology in the related art. Furthermore, in the case of the non-autonomous vehicle, it is possible to provide and guide the driver with the optimal velocity profile configured for improving fuel economy.

Modeling of various traveling environments, vehicle behavior, and traffic flows are solved by use of the reinforcement learning which is a probabilistic method, solving drawbacks of existing eco-driving-related technologies caused by uncertainty of the model.

The present invention may determine the control policy optimized by variably adapting to the change in traveling environment based on the reinforcement learning. Furthermore, the present invention may advantageously provide the cruise control technology which may be optimized through learning in accordance with the traveling situation and the traveling route of the vehicle and may be personalized to the driver.

Other aspects and exemplary embodiments of the present invention are discussed infra.

It is understood that the term "vehicle" or "vehicular" or other similar term as used herein is inclusive of motor vehicles in general such as passenger vehicles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The above and other features of the present invention are discussed infra.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
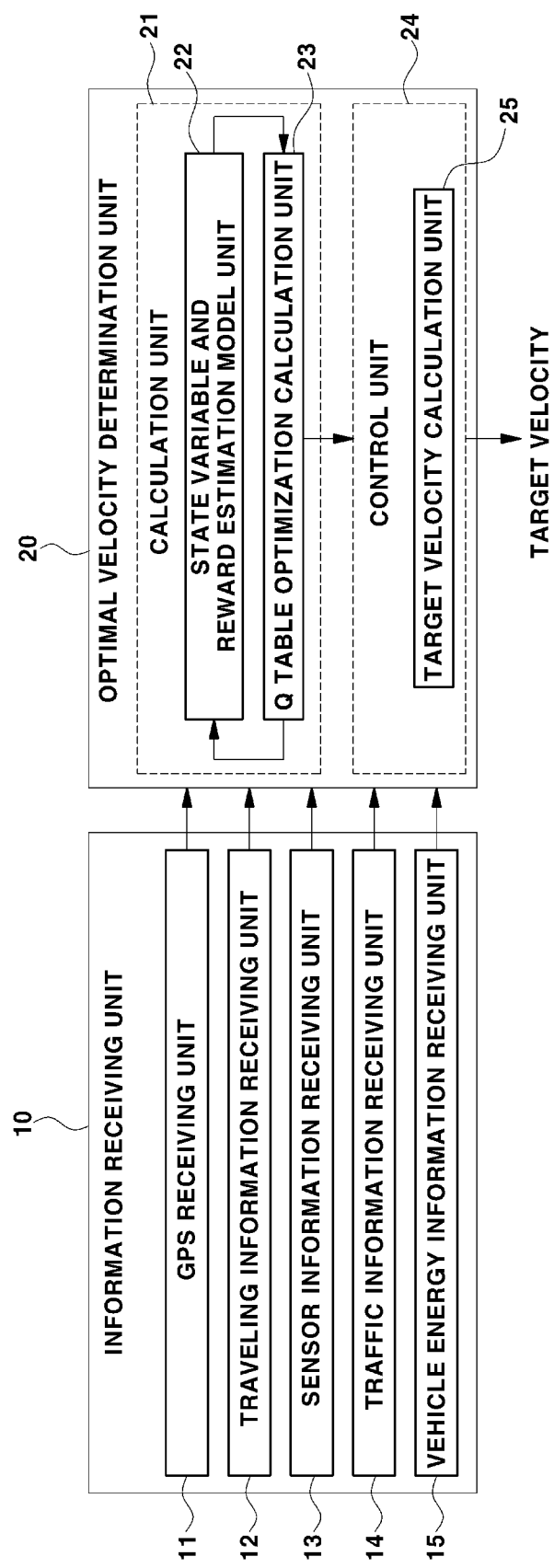
FIG. 1 is a block diagram illustrating a configuration of an apparatus of determining an optimal velocity according to various exemplary embodiments of the present invention.

It should be understood that the appended drawings are not necessarily to scale, presenting a somewhat simplified representation of various exemplary features illustrative of the basic principles of the present invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments of the present invention, it will be understood that the present description is not intended to limit the invention(s) to those exemplary embodiments. On the other hand, the invention(s) is/are intended to cover not only the exemplary embodiments of the present invention, but also various alternatives, modifications, equivalents and other embodiments, which may be included within the spirit and scope of the invention as defined by the appended claims.

Specific structural and functional descriptions disclosed in embodiments of the present invention are exemplified only for the purpose of explaining the exemplary embodiments according to the concept of the present invention, and the exemplary embodiments according to the concept of the present invention may be carried out in various forms. Furthermore, the present invention should not be interpreted as being limited to the exemplary embodiments disclosed in the exemplary embodiment, and it should be understood that the present invention includes all modifications, equivalents, and alternatives included in the spirit and the technical scope of the present invention.

Meanwhile, the terms such as "first" and/or "second" in various exemplary embodiments of the present invention may be used to describe various constituent elements, but these constituent elements should not be limited by these terms. These terms are used only for the purpose of distinguishing one constituent element from other constituent elements. For example, without departing from the scope according to the concept of the present invention, the first constituent element may be referred to as the second constituent element, and similarly, the second constituent element may also be referred to as the first constituent element.

When one constituent element is referred to as being "coupled" or "connected" to another constituent element, it should be understood that one constituent element may be coupled or directly connected to another constituent element, and an intervening constituent element can also be present between the constituent elements. When one constituent element is referred to as being "coupled directly to" or "directly connected to" another constituent element, it should be understood that no intervening constituent element is present between the constituent elements. Other expressions, that is, "between" and "just between" or "adjacent to" and "directly adjacent to", for explaining a relationship between constituent elements, should be interpreted in a similar manner.

Like reference numerals indicate like constituent elements throughout the specification. The terms used in the exemplary embodiment are for explaining the embodiments, not for limiting the present invention. Unless stated otherwise in the exemplary embodiment, a singular form also includes a plural form. The terms such as "comprise (include)" and/or "comprising (including)" used in the specification are intended to denote the mentioned constituent elements, steps, operations, and/or elements, but do not exclude presence or addition of one or more other constituent elements, steps, operations, and/or elements.

Hereinafter, the exemplary embodiments of the present invention will be described in detail with reference to the accompanying drawings.

The present invention is directed to providing an apparatus and a method for determining an optimal velocity of a vehicle, which are configured for optimizing fuel economy. The present invention is directed to providing an apparatus and a method for determining an optimal velocity of a vehicle, which are configured for optimizing fuel economy in consideration of various vehicle traveling environments and various vehicle states.

To the present end, the present invention utilizes reinforcement learning, a field of machine learning, to determine and provide a target velocity for controlling a velocity of a vehicle. In more detail, the present invention is configured to determine a control policy configured for optimizing fuel economy through the reinforcement learning in accordance with various vehicle traveling environments and various vehicle states, and to utilize the control policy to provide an autonomous vehicle with a target velocity or provide a driver of a non-autonomous vehicle with a target velocity profile.

Figure 2:
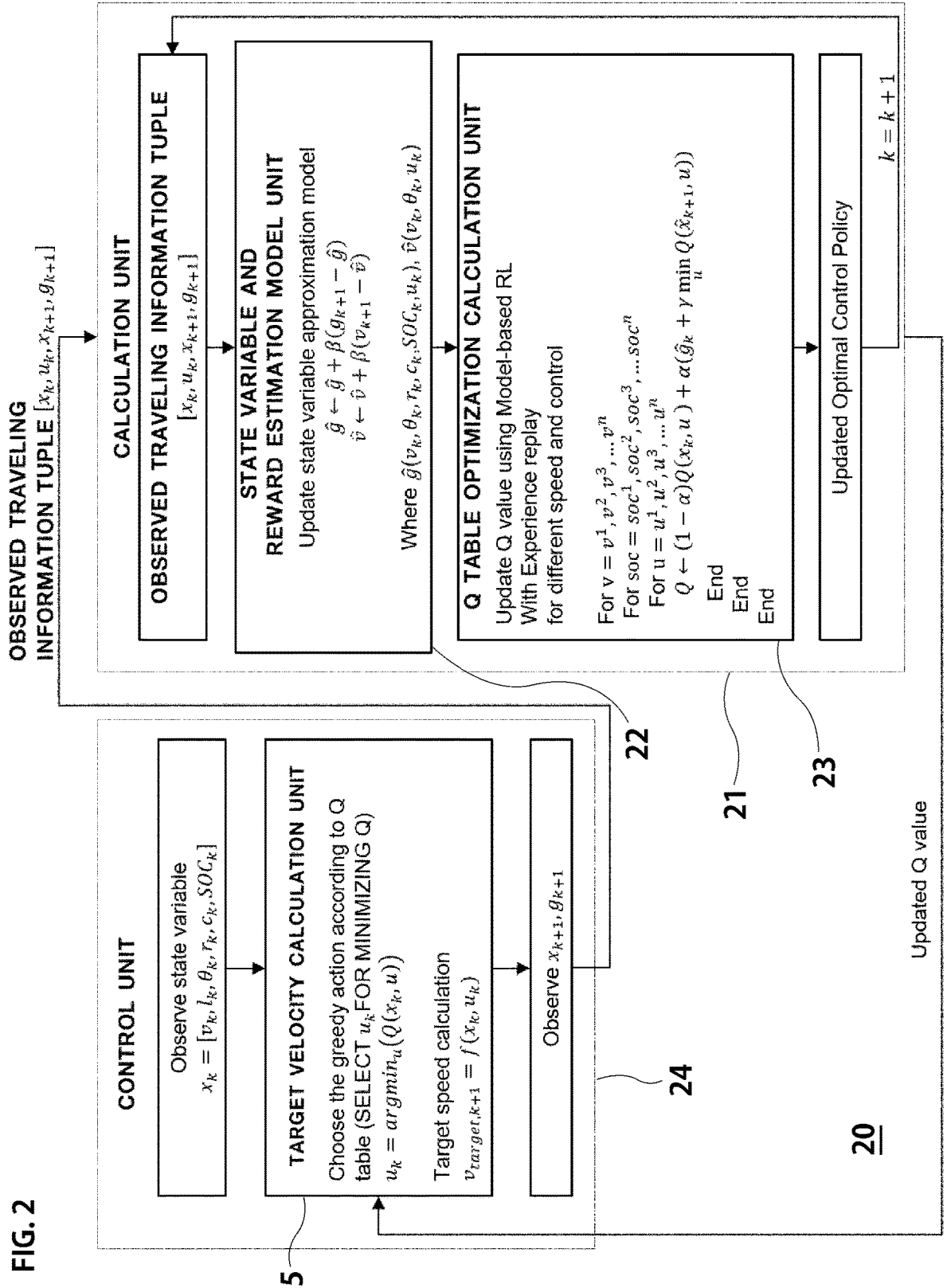
FIG. 2 is a block diagram illustrating a calculation unit and a control unit of an optimal velocity determination unit of the apparatus of determining an optimal velocity according to the exemplary embodiment of the present invention.

FIG. 1 is a block diagram illustrating a configuration of an apparatus of determining an optimal velocity according to various exemplary embodiments of the present invention, and FIG. 2 is a block diagram illustrating optimal velocity determination logic in a calculation unit and a control unit of an optimal velocity determination unit of the apparatus of determining an optimal velocity according to the exemplary embodiment of the present invention.

The present invention relates to an apparatus and a method for determining an optimal velocity of a vehicle, which are configured for providing an automatic cruise velocity profile of a vehicle by use of a reinforcement learning theory. The apparatus of determining an optimal velocity according to the exemplary embodiment of the present invention includes an information receiving unit 10 and an optimal velocity determination unit 20.

The information receiving unit 10 is configured to receive and provide information required to determine the target velocity for optimizing fuel economy of the vehicle. The information receiving unit 10 acquires vehicle traveling information and traveling environment information and provides the optimal velocity determination unit 20 with the acquired information. The optimal velocity determination unit 20 determines the target velocity by use of the vehicle traveling information and the traveling environment information provided by the information receiving unit 10.

In various exemplary embodiments of the present invention, the vehicle traveling information and the traveling environment information may include one or more of vehicle position information, information related to a current velocity of the vehicle, information related to a gradient of a traveling road, a distance from a preceding vehicle, information related to real-time traffic on a road on a vehicle traveling route, and information related to an amount of remaining energy of the vehicle.

First, a configuration of the information receiving unit will be described below in more detail.

As illustrated in FIG. 1, the information receiving unit 10 includes a global positioning system (GPS) receiving unit 11, a traveling information receiving unit 12, a sensor information receiving unit 13, a traffic information receiving unit 14, and a powertrain information receiving unit 15.

The Global Positioning System (GPS) receiving unit discretizes current vehicle position information and altitude information on a traveling route and provides the discretized information to the optimal velocity determination unit 20. The traveling information receiving unit 12 discretizes average gradient information and instant gradient information, and vehicle velocity information for each section of the traveling road and provides the discretized information to the optimal velocity determination unit 20. The sensor information receiving unit 13 receives, from a preceding vehicle sensor, a distance between the currently traveling vehicle and a preceding vehicle and provides the distance to the optimal velocity determination unit 20.

The traffic information receiving unit 14 receives, from an intelligent transport system (ITS), information related to real-time traffic on the road on the vehicle traveling route and provides the information to the optimal velocity determination unit 20. In the instant case, the traffic information receiving unit 14 may receive information related to a velocity on the road on the vehicle traveling route and provide the information to the optimal velocity determination unit 20. The traffic information receiving unit 14 may receive information related to a maximum velocity on the road on the vehicle traveling route, a limit velocity for each section, and a vehicle average velocity and provide the information to the optimal velocity determination unit 20.

The vehicle energy information receiving unit 15 receives vehicle energy information and provides the information to the optimal velocity determination unit 20. In more detail, the vehicle energy information receiving unit 15 receives real-time information related to the amount of remaining energy of the vehicle and provides the information to the optimal velocity determination unit 20. In the instant case, the information related to the amount of remaining energy of the vehicle may be the amount of remaining fuel of the vehicle or a remaining battery capacity. Typically, the remaining battery capacity may be a battery state of charge (SOC) value received from a battery management system (BMS). In the instant case, the battery is a battery that supplies operating power to a motor configured for driving the vehicle in a case in which the vehicle is driven by the motor.

The optimal velocity determination unit 20 may determine energy consumption of the traveling vehicle from the information related to the amount of remaining energy of the vehicle provided by the vehicle energy information receiving unit 15 and use the information to determine the target velocity of the vehicle. In the instant case, the energy consumption may be fuel consumption or battery electrical energy consumption, and the battery electrical energy consumption may be the change amount in battery SOC ($\Delta$SOC).

Next, the optimal velocity determination unit will be described below.

The optimal velocity determination unit 20 includes a calculation unit 21 and a control unit 24. The calculation unit 21 may not always operate in accordance with a calculation load. The calculation unit 21 may include a state variable and reward estimation model unit 22 and a Q table optimization calculation unit 23.

The state variable and reward estimation model unit 22 includes a model that utilizes vehicle traveling environment and vehicle performance information to estimate energy consumption in accordance with the current velocity and a control input (determined and provided by the control unit) for following the target velocity and estimate a velocity ($v_{k+1}$) of a next step (k+1), and the state variable and reward estimation model unit 22 provides the Q table optimization calculation unit 23 with the information estimated by the model. The Q table optimization calculation unit 23 utilizes the information provided by the state variable and reward estimation model unit 22 and the traveling information provided by the traveling information receiving unit 12 to determine and update Q table values (Q function values), performing the optimization.

The control unit 24 includes a target velocity calculation unit 25. The target velocity calculation unit 25 utilizes the Q table information optimized and provided by the Q table optimization calculation unit 23 or utilizes the previously stored Q table information to determine the target velocity in accordance with the vehicle traveling environment and determine the control input for controlling the vehicle velocity to follow the target velocity.

The target velocity determined by the control unit 24 may be set as the target velocity for autonomous driving in the case of the autonomous vehicle and may be provided to the driver, as target velocity information in a form of a velocity profile for optimizing fuel economy, in the case of the non-autonomous vehicle.

As described above, in the exemplary embodiment of the present invention, the optimal velocity determination unit 20 includes the calculation unit 21 configured to determine and update the Q table value which the control unit 24 utilizes to determine the optimal velocity (target velocity) of the vehicle for optimizing fuel economy and the control unit 24 configured to determine the target velocity and the control input by use of the Q table information.

In the optimal velocity determination unit 20 of the exemplary embodiment of the present invention, the Q table, which is an optimal control policy, is determined by the state variable and reward estimation model unit 22 and the Q table optimization calculation unit 23 of the calculation unit 21, and the target velocity is determined from the determined Q table value or the previously stored Q table value by the target velocity calculation unit 25 of the control unit 24.

The descriptions will be made for each of the above-mentioned configurations. In the exemplary embodiment of the present invention, the control unit 24 of the optimal velocity determination unit 20 observes the current vehicle state and finds the Q function table value of the corresponding state variable based on the observed current vehicle state. Furthermore, the control unit 24 finds and selects a control input (u) having the smallest Q value among the Q values (x, {$u_1$, $u_2$, $u_3$ ... }) of the corresponding state variable and determines the selected control input as an optimal control input (u).

In more detail, first, the state variable representing the current vehicle state is determined by observing the current vehicle state through a sensor and predetermined logic provided in a vehicle.

In the instant case, the state variable representing the observed current vehicle state is represented by the following Equation 1.

$$x_k = [v_k, l_k, \theta_k, r_k, c_k, SOC_k] \quad (1)$$

The state variables are pieces of information representing the real-time vehicle states and inputted to the optimal velocity determination unit 20 through the information receiving unit 10. Among the state variables, $v_k$ represents the vehicle velocity inputted through the traveling information receiving unit 12, and $l_k$ represents the vehicle position information inputted through the Global Positioning System (GPS) receiving unit 11. Furthermore, $\theta_k$ represents a road gradient (vehicle gradient) inputted through the traveling information receiving unit 12. Furthermore, the subscript k represents a step for each period.

The $r_k$ represents a distance from the preceding vehicle detected by the preceding vehicle sensor and inputted through the sensor information receiving unit 13, and $c_k$ represents a degree of traffic jam which is information related to real-time traffic on the road inputted through the traffic information receiving unit 14. The degree of traffic jam is information representing a real-time traffic volume on the road on which the vehicle currently travels, and the degree of traffic jam may be an average vehicle velocity on the road. $SOC_k$ represents the battery SOC inputted through the vehicle energy information receiving unit 15.

The target velocity calculation unit 25 finds a control input uk for minimizing the Q function in accordance with the observed state variable $x_k$ (the vehicle speed $v_k$, the Global Positioning System (GPS) position information $l_k$, the road gradient $\theta_k$, the distance $r_k$ from the preceding vehicle, the degree $c_k$ of traffic jam, or the battery SOC $SOC_k$).

The Q table is a table having values corresponding to the state variable $x_k$ and the control input $u_k$ of the vehicle. In the instant case, the value of the Q table represents estimation of expected cost-to-go function value which is an objective function which may be obtained while the vehicle travels when the current state of the vehicle is x and the control input is inputted as u. That is, the values Q ($x_k$, $u_1$), Q ($x_k$, $u_2$), Q ($x_k$, $u_3$) ... Q ($x_k$, $u_n$) are compared based on provided $x_k$ to find the smallest control input $u_k$ value.

The control input may be motor torque (which may be a command value) or may be an increase or a decrease in velocity of the vehicle (e.g., an increase by 1 km/h or a decrease by 2 km/h) in a simplified and discretized form. In the case in which the control input is the motor torque, the motor torque may be controlled by directly providing target motor torque during the process of controlling the vehicle, and the target velocity calculation unit 25 may determine and determine the target velocity from the vehicle powertrain and the equation of dynamics. That is, the target velocity calculation unit 25 may determine the target velocity from the control input u through a predetermined non-linear vehicle equation, that is, $f(x_k, u_k)$ in FIG. 2.

As illustrated in FIG. 2, the calculation unit 21 of the optimal velocity determination unit 20 determines an optimal control policy (Q table) through the state variable and reward estimation model unit 22 and the Q table optimization calculation unit 23. A observed traveling information tuple is a series of traveling information including the state variable $x_k$ and the control input $u_k$ inputted while the vehicle travels, an objective function cost value $g_{k+1}$ determined by use of the control input $u_k$, and a state variable $x_{k+1}$ having transitioned to the next step.

The calculation unit 21 of the optimal velocity determination unit 20 performs approximation on the state variable and reward estimation model based on the traveling information through the state variable and reward estimation model unit 22 and updates the Q value through the Q table optimization calculation unit 23, deriving the optimization control policy.

The state variable and reward estimation model unit 22 learns an approximate model ĝ matrix by use of the observed traveling information tuple. The ĝ ($v_k$, $\theta_k$, $r_k$, $c_k$, $SOC_k$, $u_k$) matrix determines the cost value $g_{k+1}$ of the objective function when the specific vehicle velocity $v_k$, the road gradient $\theta_k$, the distance $r_k$ from the preceding vehicle, the road traffic information $c_k$, the battery SOC $SOC_k$, and the control input $u_k$ are applied, and the matrix performs learning by use of a predetermined learning rate $\beta$. Furthermore, when a vehicle velocity prediction model of the k+1 step is given, that is, the current vehicle velocity $v_k$, the road gradient $\theta_k$, and the control input $u_k$ are given, a velocity estimation model v̂ ($v_k$, $\theta_k$, $u_k$) for estimating the vehicle velocity $v_{k+1}$ of the next step (k+1) is also learned by use of the learning rate $\beta$ from the observed traveling information.

This is expressed by the following equations.

$$\hat{g} \leftarrow \hat{g} + \beta(g_{k+1} - \hat{g}) \quad (2)$$

$$\hat{v} \leftarrow \hat{v} + \beta(v_{k+1} - \hat{v}) \quad (3)$$

The reward $g_{k+1}$ is defined, as follows, as a value made by applying weighting to each of a function ($d(r_{k+1})$) in respect to the time ($\Delta$ time) for which the vehicle travels a predetermined unit distance and a distance ($r_{k+1}$) from the preceding vehicle, and a function ($v_{limit}(v_{k+1})$) in respect to a target velocity deviation, and then summing up the fuel consumption or battery electrical energy consumption (the change in battery SOC, $\Delta SOC$) and the values to which the weighting is applied.

$$g_{k+1} = \left( \int_{d_k}^{d_{k+1}} \frac{S\dot{O}C}{v(d)} dd + \int_{d_k}^{d_{k+1}} \frac{1}{v(d)} dd \right) + \eta \cdot d(r_{k+1}) + \xi \cdot v_{limit}(v_{k+1}) = \quad (4)$$

$$\Delta SOC + \omega \cdot \Delta time + \eta \cdot d(r_{k+1}) + \xi \cdot v_{limit}(v_{k+1})$$

In the instant case, $$d(r_{k+1}) = \begin{cases} 0 & \text{if } r_{k+1} > r_{safe} \\ \dfrac{1}{r_{k+1}} & \text{if } r_{k+1} \leq r_{safe} \end{cases} \quad (5)$$

$$v_{limit}(v_{k+1}) = (v_{k+1} - v_{ref})^2. \quad (6)$$

In the instant case, $\omega$, $\eta$, $\xi$ represent predetermined weighting constants, $r_{k+1}$ represents the distance from the preceding vehicle, $r_{safe}$ represents a safety distance from the preceding vehicle which is predetermined as a constant value, and $v_{ref}$ represents a predetermined reference velocity.

The state variable and reward estimation model unit 22 updates non-linear state variable estimation models ĝ and v̂ through the observed state variables $x_k$ and $x_{k+1}$ and the reward value $g_{k+1}$.

Next, as illustrated in FIG. 2, the Q table optimization calculation unit 23 utilizes a model-based reinforcement learning algorithm to update the Q value representing the control policy in accordance with various traveling environments (the vehicle velocity, the Global Positioning System (GPS) position information, the road gradient, the distance from the preceding vehicle, and the degree of traffic jam).

That is, the Q value is updated by testing various control inputs $u = u^1, u^2, u^3, \ldots, u^n$ with respect to various velocities $v = v^1, v^2, v^3, \ldots, v^n$ and the battery $SOC = SOC^1, SOC^2, SOC^3, \ldots, SOC^n$.

In the instant case, some information related to the state variable transition from $x_k$ to $x_{k+1}$ is utilized from the observed traveling information tuple is utilized. Furthermore, as illustrated in FIG. 2, the Q value is updated by repeating the for loop of the various control inputs $u = u^1, u^2, u^3, \ldots, u^n$ with respect to the respective velocities $v = v^1, v^2, v^3, \ldots, v^n$ and the battery $SOCs = SOC^1, SOC^2, SOC^3, \ldots, SOC^n$ by use of a transition probability of ($l_{k+1}$, $\theta_{k+1}$, $r_{k+1}$, and $c_{k+1}$) in ($l_k$, $\theta_k$, $r_k$, and $c_k$).

This is represented by the following equations.

---

For i =1 to $N_v$ do (v = $v^1, v^2, v^3, \ldots v^{N_v}$)
  For j =1 to $N_{soc}$ do (soc = $soc^1, soc^2, soc^3, \ldots soc^{N_{soc}}$)
    For k=1 to $N_u$ do (u = $u^1, u^2, u^3, \ldots u^{N_u}$)
    Q $\leftarrow$ (1 – α) Q ($x_k$ = [$v^i, l_k, \theta_k, r_k, c_k, SOC^j$], $u^k$)
    +α(ĝ$_{k+1}$ ($v^i, \theta_k, r_k, SOC^j, u^k$) +

$\gamma \min_u Q(\hat{x}_{k+1} = [\hat{v}_{k+1}(v_k, \theta_k, u_k), l_{k+1}, \theta_{k+1}, r_{k+1}, c_{k+1}, \widetilde{SOC}_{k+1}], u)$ End
  End
End

---

As described above, the Q table optimization calculation unit 23 utilizes the model-based reinforcement learning algorithm to update the Q value representing the control policy in accordance with various traveling environments (the vehicle velocity, the Global Positioning System (GPS) position information, the road gradient, the distance from the preceding vehicle, and the degree of traffic jam).

The main feature of the present invention is the configuration of the state variable and reward estimation model unit 22 which utilizes the approximated model to determine the optimal control policy, unlike general reinforcement learning, improving learning speed and performance and ensuring convergence of the control policy.

Another differentiated feature of the present invention is that the cost value (reward) matrix of the objective function including the energy consumption model configured by vehicle dynamics and the powertrain is configured based on the model-based reinforcement learning structure to control the fuel economy optimization speed, and the calculation unit 21 using the Q table is configured through the cost value matrix.

The Q table optimization calculation unit 23 determines the value of the Q table based on the state variable and reward estimation model, configures the for loop in respect to the vehicle velocity, the battery SOC, and the control input based on historic data of the existing observed traveling information tuple by use of the model, and optimizes the Q table by performing experience replay through the for loop, which makes it possible to ensure very fast convergence and optimality unlike reinforcement learning, improving fuel economy performance In various exemplary embodiments of the present invention, the calculation unit 21 of the optimal speed determination unit 20 may be set to perform event-based calculation without performing the real-time calculation while the vehicle travels, when there is a limit on the amount of real-time calculation. That is, when the calculation load is large, the calculation unit 21 may use the control policy (Q function value), obtained through the previous learning, as it is, but updates the control policy only when the calculation load is not large.

As described above, the present invention is configured to generate a fuel economy optimization cruise velocity profile suitable for various traveling situations of the vehicle by use of the model-based reinforcement learning, and may provide the autonomous vehicle with the optimized target velocity by applying a method of learning the control policy for variably optimizing fuel economy in accordance with the traveling situation of the vehicle, based on the reinforcement learning (Q-learning) which is a kind of machine learning algorithm.

In various exemplary embodiments of the present invention, in the case of the non-autonomous vehicle, the target velocity may be provided, as an element for providing driving assistance guidance, to the driver. Furthermore, the control policy is optimized in accordance with the current vehicle velocity, the information related to the Global Positioning System (GPS) position (position on the route) of the vehicle, the road gradient, the distance from the preceding vehicle, and the degree of traffic jam on the road on which the vehicle currently travels, and the control policy is learned by use of the model-based reinforcement learning in accordance with various traveling situations.

In various exemplary embodiments of the present invention, the control policy derivation and learning structure may be configured in a form of adaptive feedback that learns and adapts to, in real time, the road traveling situation based on the reinforcement learning algorithm.

Furthermore, the term related to a control device such as "controller", "control unit", "control device" or "control module", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present invention. The control device according to exemplary embodiments of the present invention may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may generate a control signal according to the processing result.

The control device may be at least one microprocessor operated by a predetermined program which may include a series of commands for carrying out the method included in the aforementioned various exemplary embodiments of the present invention.

The aforementioned invention can also be embodied as computer readable codes on a computer readable recording medium. The computer readable recording medium is any data storage device that can store data which may be thereafter read by a computer system. Examples of the computer readable recording medium include hard disk drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet).

In various exemplary embodiments of the present invention, each operation described above may be performed by a control device, and the control device may be configured by a plurality of control devices, or an integrated single control device.

In various exemplary embodiments of the present invention, the control device may be implemented in a form of hardware or software, or may be implemented in a combination of hardware and software.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

Furthermore, the term of "fixedly connected" signifies that fixedly connected members always rotate at a same speed. Furthermore, the term of "selectively connectable" signifies "selectively connectable members rotate separately when the selectively connectable members are not engaged to each other, rotate at a same speed when the selectively connectable members are engaged to each other, and are stationary when at least one of the selectively connectable members is a stationary member and remaining selectively connectable members are engaged to the stationary member".

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. An apparatus for determining an optimal velocity of a vehicle, the apparatus comprising:
    an information receiving unit configured to receive and provide vehicle traveling information and traveling environment information which are state variables representing vehicle states required to determine a target velocity for optimizing vehicle fuel economy;
    an optimal velocity determination unit configured to determine the target velocity in accordance with a vehicle traveling environment by use of a state variable and reward estimation model and a Q table having values according the state variables and a control input, from the vehicle traveling information and the traveling environment information provided by the information receiving unit; and
    a control unit configured to control a vehicle velocity to follow the target velocity,
    wherein the control unit is configured to select a control input (u) having a smallest Q value among Q values (x, {u1, u2, u3 . . . }) of corresponding state variable and determine the selected control input as an optimal control input (u) to follow the target velocity,
    wherein the state variable and reward estimation model unit updates non-linear state variable estimation models through the state variables and a reward cost value,
    wherein the reward cost value (gk) is determined, by the following equation, as a value made by applying weighting to each of a function ($d(r_{k+1})$) in respect to a time ($\Delta time$) for which the vehicle travels a predetermined unit distance and the distance ($r_{k+1}$) from a preceding vehicle, and a function ($v_{limit}(v_{k+1})$) in respect to a target velocity deviation, and then summing up a change amount in battery SOC ($\Delta SOC$) and the values to which the weighting is applied, $$g_{k+1} = \left( \int_{d_k}^{d_{k+1}} \frac{S\dot{O}C}{v(d)} dd + \int_{d_k}^{d_{k+1}} \frac{1}{v(d)} dd \right) + \eta \cdot d(r_{k+1}) + \xi \cdot v_{limit}(v_{k+1}) = \quad \text{Equation}$$

$$\Delta SOC + \omega \cdot \Delta time + \eta \cdot d(r_{k+1}) + \xi \cdot v_{limit}(v_{k+1})$$

$$\text{wherein, } d(r_{k+1}) = \begin{cases} 0 & \text{if } r_{k+1} > r_{safe} \\ \dfrac{1}{r_{k+1}} & \text{if } r_{k+1} \leq r_{safe} \end{cases},$$

$$v_{limit}(v_{k+1}) = (v_{k+1} - v_{ref})^2,$$

and
    $\omega, \eta, \xi$ represent predetermined weighting constants, $r_{safe}$ represents a safety distance from the preceding vehicle which is predetermined as a constant value, and $v_{ref}$ represents a predetermined reference velocity.

2. The apparatus of claim 1, wherein the vehicle traveling information and the traveling environment information, which are the state variables, include one or more of vehicle position information, information related to a current velocity of the vehicle, information related to a gradient of a traveling road, a distance from the preceding vehicle, information related to real-time traffic on a road on a vehicle traveling route, and information related to an amount of remaining energy of the vehicle.

3. The apparatus of claim 2, wherein the information receiving unit includes:
    a Global Positioning System (GPS) receiving unit configured to receive vehicle position information;
    a traveling information receiving unit configured to receive the information related to the current velocity of the vehicle and the information related to the gradient of the traveling road;
    a sensor information receiving unit configured to receive the distance from the preceding vehicle;
    a traffic information receiving unit configured to receive the information related to the real-time traffic on the road on the vehicle traveling route; and
    a vehicle energy information receiving unit configured to the information related to the amount of the remaining energy of the vehicle.

4. The apparatus of claim 3, wherein the information related to the amount of remaining energy of the vehicle is information related to a state of charge (SOC) value of a battery that supplies operating power to a motor configured for driving the vehicle.

5. The apparatus of claim 1, wherein the optimal velocity determination unit includes:
    a calculation unit configured to estimate energy consumption according to a current velocity ($v_k$) of the vehicle and the control input determined and provided by the control unit, and a velocity ($v_{k+1}$) of a next step by use of the state variable and reward estimation model, from the vehicle traveling information and the traveling environment information, and to determine and update the Q table value by use of the estimated information; and
    the control unit configured to determine a target velocity and a control input having a smallest Q function value, the Q function value being a value of a Q table, by use of Q table information provided by the calculation unit or previously stored Q table information.

6. The apparatus of claim 5, wherein the control unit determines the target velocity by use of a predefined equation ($f(x_k, u_k)$), from the state variable ($x_k$) and the determined control input ($u_k$).

7. The apparatus of claim 5, wherein the calculation unit includes:
    a state variable and reward estimation model unit configured to estimate the energy consumption according to the current velocity ($v_k$) of the vehicle and the control input, and the velocity ($v_{k+1}$) of the next step by use of the state variable and reward estimation model, from the vehicle traveling information and the traveling environment information; and
    a Q table optimization calculation unit configured to determine and update the Q table value by use of the information estimated by the state variable and reward estimation model unit and provide the updated Q table value to the control unit.

8. The apparatus of claim 7, wherein the state variable and reward estimation model unit determines the current velocity ($v_k$) of the vehicle, a gradient ($\theta_k$) of a traveling road, a distance ($r_k$) from the preceding vehicle, road traffic ($c_k$), and a cost value ($g_{k+1}$) of an objective function corresponding to an amount of remaining energy of the vehicle and a control input ($u_k$), which are state variables observed in a current step (k), and the state variable and reward estimation model unit learns the cost value ($g_{k+1}$) and an approximate model ($\hat{g}(v_k, \theta_k, r_k, c_k, SOC_k, u_k)$) matrix, which is the state variable and reward estimation model, by use of a predetermined learning rate ($\beta$).

9. The apparatus of claim 7, wherein the state variable and reward estimation model unit learns a vehicle velocity ($v_{k+1}$) prediction model of the next step (k+1), which is a velocity estimation model ($\hat{v}(v_k, \theta_k, u_k)$) configured for estimating the vehicle velocity ($v_{k+1}$) of the next step from the current velocity ($v_k$) of the vehicle, a gradient ($\theta_k$) of the traveling road, and a control input ($u_k$) of the current step, by use of a predetermined learning rate ($\beta$).

10. The apparatus of claim 7, wherein the Q table optimization calculation unit updates the Q table value representing a control policy according to the vehicle traveling information and the traveling environment information by use of a model-based reinforcement learning algorithm.

11. A method of determining an optimal velocity of a vehicle, the method comprising:

receiving, by an information receiving unit, vehicle traveling information and traveling environment information which are state variables representing vehicle states required to determine a target velocity for optimizing vehicle fuel economy;

determining, by an optimal velocity determination unit, the target velocity in accordance with a vehicle traveling environment by use of a state variable and reward estimation model and a Q table having values according to the state variables and a control input, from the vehicle traveling information and the traveling environment information provided by the information receiving unit; and controlling, by a control unit, a vehicle velocity to follow the target velocity, wherein the control unit is configured to select a control input (u) having a smallest Q value among Q values (x, {u1, u2, u3 . . . }) of corresponding state variable and determine the selected control input as an optimal control input (u) to follow the target velocity, wherein the state variable and reward estimation model unit updates non-linear state variable estimation models through the state variables and a reward cost value, wherein the reward cost value (gk) is determined, by the following equation, as a value made by applying weighting to each of a function ($d(r_{k+1})$) in respect to a time ($\Delta time$) for which the vehicle travels a predetermined unit distance and the distance ($r_{k+1}$) from a preceding vehicle, and a function ($v_{limit}(v_{k+1})$) in respect to a target velocity deviation, and then summing up a change amount in battery SOC ($\Delta SOC$) and the values to which the weighting is applied, $$g_{k+1} = \left( \int_{d_k}^{d_{k+1}} \frac{\dot{SOC}}{v(d)} dd + \int_{d_k}^{d_{k+1}} \frac{1}{v(d)} dd \right) + \eta \cdot d(r_{k+1}) + \xi \cdot v_{limit}(v_{k+1}) = \Delta SOC + \omega \cdot \Delta time + \eta \cdot d(r_{k+1}) + \xi \cdot v_{limit}(v_{k+1})$$

$$\text{wherein, } d(r_{k+1}) = \begin{cases} 0 \text{ if } r_{k+1} > r_{safe} \\ \frac{1}{r_{k+1}} \text{ if } r_{k+1} \leq r_{safe} \end{cases},$$

$$v_{limit}(v_{k+1}) = (v_{k+1} - v_{ref})^2,$$

$\omega$, $\eta$, $\xi$ represent predetermined weighting constants, $r_{safe}$ represents a safety distance from the preceding vehicle which is predetermined as a constant value, and $v_{ref}$ represents a predetermined reference velocity.

12. The method of claim 11, wherein the vehicle traveling information and the traveling environment information, which are the state variables, include vehicle position information, information related to a current velocity of the vehicle, information related to a gradient of a traveling road, a distance from the preceding vehicle, information related to real-time traffic on a road on a vehicle traveling route, and information related to an amount of remaining energy of the vehicle.

13. The method of claim 11, wherein the optimal velocity determination unit includes:

a calculation unit configured to estimate energy consumption according to a current velocity ($v_k$) of the vehicle and the control input determined and provided by the control unit, and a velocity ($v_{k+1}$) of a next step by use of the state variable and reward estimation model, from the vehicle traveling information and the traveling environment information, and to determine and update a Q table value by use of the estimated information; and the control unit configured to determine a target velocity and a control input having a smallest Q function value, the Q function value being a value of a Q table, by use of Q table information provided by the calculation unit or previously stored Q table information.

14. The method of claim 13, wherein the control unit determines the target velocity by use of a predefined equation ($f(x^k, u_k)$), from the state variable ($x_k$) and the determined control input ($u_k$).

15. The method of claim 13, wherein the calculation unit includes:

a state variable and reward estimation model unit configured to estimate the energy consumption according to the current velocity ($v_k$) of the vehicle and the control input, and the velocity ($v_{k+1}$) of the next step by use of the state variable and reward estimation model, from the vehicle traveling information and the traveling environment information; and a Q table optimization calculation unit configured to determine and update the Q table value by use of the information estimated by the state variable and reward estimation model unit and provide the updated Q table value to the control unit.

16. The method of claim 15, wherein the state variable and reward estimation model unit determines a current velocity ($v_k$) of the vehicle, a gradient ($\theta_k$) of a traveling road, a distance ($r_k$) from the preceding vehicle, road traffic ($c_k$), and a cost value ($g_{k+1}$) of an objective function corresponding to an amount of remaining energy of the vehicle and a control input ($u_k$), which are state variables observed in a current step (k), and the state variable and reward estimation model unit learns the cost value ($g_{k+1}$) and an approximate model ($\hat{g}(v_k, \theta_k, r_k, c_k, SOC_k, u_k)$) matrix, which is the state variable and reward estimation model, by use of a predetermined learning rate ($\beta$).

17. The method of claim 15, wherein the state variable and reward estimation model unit learns a vehicle velocity ($v_{k+1}$) prediction model of the next step (k+1), which is a velocity estimation model ($\hat{v}(v_k, \theta_k, u_k)$) configured for estimating the vehicle velocity ($v_{k+1}$) of the next step from the current velocity ($v_k$) of the vehicle, a gradient ($\theta_k$) of a traveling road, and a control input ($u_k$) of the current step, by use of a predetermined learning rate ($\beta$).

18. The method of claim 15, wherein the Q table optimization calculation unit updates the Q table value representing a control policy according to the vehicle traveling information and the traveling environment information by use of a model-based reinforcement learning algorithm.

* * * * *